United States Patent [19]
Uemura et al.

[11] Patent Number: 5,744,380
[45] Date of Patent: Apr. 28, 1998

[54] METHOD OF FABRICATING AN EPITAXIAL WAFER

[75] Inventors: Noriyuki Uemura; Hisami Motoura; Masashi Nishimura; Mitsuo Kohno, all of Kanagawa-ken, Japan

[73] Assignee: Komatsu Electronic Metals Co., Ltd., Kanagawa-ken, Japan

[21] Appl. No.: 806,310

[22] Filed: Feb. 26, 1997

Related U.S. Application Data

[63] Continuation of Ser. No. 294,760, Aug. 23, 1994, abandoned.

[30] Foreign Application Priority Data

Aug. 23, 1993 [JP] Japan ................. 5-231025

[51] Int. Cl.$^6$ ................. H01L 21/66; G01N 21/88
[52] U.S. Cl. ................. 438/14; 438/478; 438/507; 438/974; 117/904; 117/13; 117/14; 117/43; 117/49
[58] Field of Search ................. 117/7, 13, 14, 117/49, 43, 904; 148/33, 33.2; 437/132, 126, 8; 438/14, 507, 478, 974

[56] References Cited

U.S. PATENT DOCUMENTS

| | | | |
|---|---|---|---|
| 4,391,524 | 7/1983 | Steigmeier et al. | 356/338 |
| 4,401,506 | 8/1983 | Otsuka | 117/935 |
| 4,402,613 | 9/1983 | Daly et al. | 356/446 |
| 4,509,990 | 4/1985 | Vasudev | 437/24 |
| 4,598,997 | 7/1986 | Steigmeier et al. | 356/237 |
| 4,722,764 | 2/1988 | Herzer et al. | 117/49 |
| 4,863,877 | 9/1989 | Fan et al. | 117/8 |
| 4,876,218 | 10/1989 | Pessa et al. | 437/132 |
| 4,927,471 | 5/1990 | Okuda | 437/132 |
| 4,945,254 | 7/1990 | Robbins | 250/571 |
| 5,091,333 | 2/1992 | Fan et al. | 437/132 |
| 5,141,894 | 8/1992 | Bisaro et al. | 437/132 |
| 5,156,995 | 10/1992 | Fitzgerald, Jr. et al. | 437/132 |
| 5,202,284 | 4/1993 | Kamins et al. | 437/106 |
| 5,221,367 | 6/1993 | Chisholm et al. | 148/33 |
| 5,252,173 | 10/1993 | Inoue | 437/132 |
| 5,296,047 | 3/1994 | Fellner | 148/33 |
| 5,373,804 | 12/1994 | Tachimori et al. | 117/13 |
| 5,506,672 | 4/1996 | Moslehi | 356/359 |
| 5,508,800 | 4/1996 | Miyashita et al. | 356/30 |

FOREIGN PATENT DOCUMENTS

| | | |
|---|---|---|
| 0 644 588 | 3/1995 | European Pat. Off. . |
| 62-261138 | 11/1987 | Japan . |
| 6-345600 | 12/1994 | Japan . |
| 6-349923 | 12/1994 | Japan . |
| 7-62523 | 3/1995 | Japan . |
| 7-86539 | 3/1995 | Japan . |
| 7-86540 | 3/1995 | Japan . |
| 8-33354 | 3/1996 | Japan . |
| 8-162406 | 6/1996 | Japan . |

OTHER PUBLICATIONS

Taijing et al., Detection and Characterization of Microdefects and Microprecipitates in Si Wafers by Brewster Angle Illumination Using an Optical Fiber system, Journal of Crystal Growth, vol. 114, 1991, pp. 64–70.

Fillard et al., Submicron Optical Sectioning Microscopy: A Particular Inverse Problem Solution Adapted to Epilayer Defect Analysis, Journal of Crystal Growth, vol. 103, 1990, pp. 120–125.

(List continued on next page.)

Primary Examiner—Mary Wilczewski
Attorney, Agent, or Firm—Sughrue, Mion, Zinn, Macpeak & Seas, PLLC

[57] ABSTRACT

There is provided a high quality epitaxial water on which the density of microscopic defects in the epitaxial layer is reduced to keep the GOI thereof sufficiently high and to reduce a leakage current at the P-N junction thereof when devices are incorporated, to thereby improve the yield of such devices. In an epitaxial wafer obtained by forming an epitaxial layer on a substrate, the density of IR laser scatterers is $5\times10^5$ pieces/cm$^3$ or less throughout the epitaxial layer.

4 Claims, 7 Drawing Sheets

OTHER PUBLICATIONS

Shirai, Determination of Oxygen Concentration in Single–Side Polished Czochralski–Grown Silicon Wafers by P–Polarized Brewster Angle Incidence Infrared Spectroscopy, J. Electrochem. Soc., vol. 138, No. 6, Jun. 1991, pp. 1784–1787.

Moriya et al., "Development of Non–Destructive Bulk Micro–Defect Analyzer for Si Wafers", Journal of Crystal Growth, vol. 128, No. 1–4, Mar. 1993, pp. 304–309.

"Si Wafers for Next Generation ULSI" *20th Symposium on ULSI Ultra Clean Technology*, pp. 90–101; Tokyo, Japan, Dec. 20–22, 1993.

*The American Heritage Dictionary*, 2nd College Edition, Boston: Houghton Mifflin Co., 1982, p. 1123.

Defect Control in Semiconductors, Proceedings of the International Conference on the Science and Technology of Defect Control in Semiconductors, The Yokohama 21st Century Forum, Yokohama, Japan, Sep. 17–22, 1989, edited by K. Sumino, pp. 1499–1504.

Non–Intrusive Mapping of Subsurface Defects in Semiconductors, Applied Physics A55, D. Guidotti, et al, pp. 139–143.

METHOD OF FABRICATING AN EPITAXIAL WAFER

This is a Continuation of application Ser. No. 08/294,760 filed Aug. 23, 1994, now abandoned.

BACKGROUND OF THE INVENTION

1. Field of the Invention

The present invention relates to an epitaxial wafer and, more particularly, to reduction of micro-defects associated with electrical characteristics of the wafer such as the gate oxide integrity (GOI) thereof.

2. Description of the Prior Art

Various devices are incorporated in a surface layer of an epitaxial wafer. In order that those devices properly electrically operate, the value of GOI thereof must be greater than a prescribed value, and a leakage current at a P-N junction formed in an epitaxial layer must be smaller than a prescribed value. However, factors affecting the electrical characteristics of the devices as described above have not been fully identified. Therefore, not a few such devices are judged to be defective because the GOI thereof is smaller than the prescribed value, or the leakage current at the P-N junction thereof is greater than the prescribed value. This has resulted in a decrease in the yield of such devices.

SUMMARY OF THE INVENTION

It is an object of the present invention to provide a high quality epitaxial wafer which is able to keep GOI sufficiently high, to reduce current leakage at the P-N junction thereof when devices are incorporated, and to thereby improve the yield of such devices.

After researching to achieve the above-described object, the present inventors have turned attention to laser scatterers of a semiconductor wafer which produce scattered light when the wafer is irradiated by an IR (Infrared) laser on a surface of the wafer, and found that GOI of the wafer is deteriorated when there are many such IR laser scatterers. It has been also revealed that an increase in the number of the IR laser scatterers results in an increase in the current leakage at a P-N junction. Further, measurement has been done on the density of IR laser scatterers in an epitaxial wafer obtained by forming an epitaxial layer on a semiconductor wafer substrate, and it has been revealed that the epitaxial layer grows with succeeding a density of IR laser scatterers of the substrate at the side of the interface with the substrate, while the density goes down when departing from the interface and finally goes to zero at the surface of the epitaxial layer. Thus, it has been revealed that such a profile of the IR laser scatterer density in the epitaxial layer causes deterioration in the electrical characteristics of active regions of devices, which finding led to the completion of the present invention.

According to a first aspect of the present invention, there is provided an epitaxial wafer comprising a substrate and an epitaxial layer formed on the substrate, wherein: the epitaxial layer has a density of IR laser scatterers of $5 \times 10^5$ pieces/cm$^3$ or less throughout the epitaxial layer. The substrate may be a wafer fabricated using the floating zone melting method, or a wafer fabricated using the Czochralski method wherein the pull rate is 0.6 mm/min. or slower. The substrate may also be a wafer which is fabricated according to the Czochralski method and is thereafter subjected to a heat treatment at 1330° to 1400° C. for 0.5 Hr or longer.

According to a second aspect of the present invention, there is provided an epitaxial wafer comprising a substrate and an epitaxial layer formed on the substrate, wherein the epitaxial layer is comprised of a first and a second epitaxial sub-layers, the first epitaxial sub-layer is formed on the substrate, has the same conductivity type with the substrate, and has essentially the same electrical resistivity with the substrate, and the second epitaxial sub-layer is formed on the first sub-layer, has a density of IR laser scatterers of $5 \times 10^5$ pieces/cm$^3$ or less, and has an electrical resistivity higher than that of the first sub-layer.

DETAILED DESCRIPTION OF THE PREFERRED EMBODIMENT

An embodiment of the present invention will now be described. Silicon wafer samples were produced by fabricating a single crystal silicon ingot using the pull method, i.e., the Czochralski method, and by performing processes of slicing, lapping, chamfering and chemical polishing thereon. The specifications of the samples were as follows.

Diameter: 6 inches

Crystal Axis: <100>

P-type

Boron-doped

Resistivity: 10 to 20 Ωcm

Concentration of Oxygen: 12 to $15 \times 10^{17}$ atoms/cm$^3$

The above specification are shown in accordance with the Annual Book of ASTM Standards of the year 1979. The measurements shown in the following description are based on this specification. The density of IR laser scatterers was measured on the samples and GOI was measured on MOS capacitors which have been actually fabricated using the samples.

Figure 1:
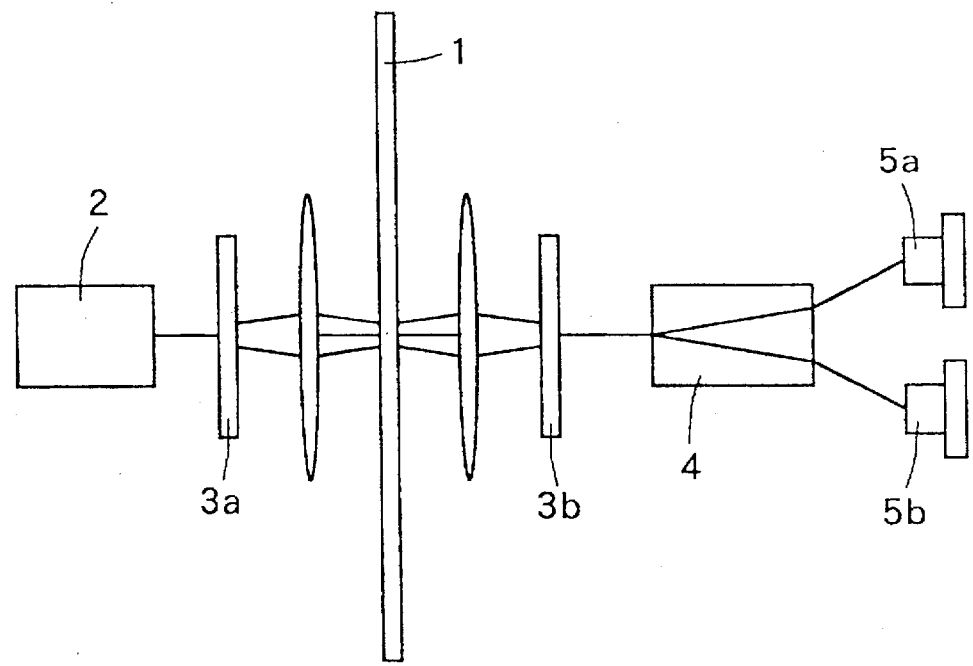
FIG. 1 illustrates a method of measuring the density of IR laser scatterers.

FIG. 1 shows a device for measuring the density of IR laser scatterers in the above-described sample. A laser beam having a wavelength of 1.3 μm is vertically directed from a laser source 2 to the surface of a silicon wafer 1 through a first prism 3a and is focused on the surface of the silicon wafer 1 or in the interior thereof. The wafer 1 is then slid to scan a plurality of arbitrarily determined points on the surface of the wafer 1 or in the interior thereof. The laser beam which has passed through the wafer 1 is led to an analyzer 4 through a second prism 3b and a phase shift of the beam is detected using two detectors 5a and 5b. When the beam impinges upon a defect in the wafer 1, there will be a slight shift in the phase thereof. Thus, the defect can be detected by detecting the phase shift.

Figure 2:
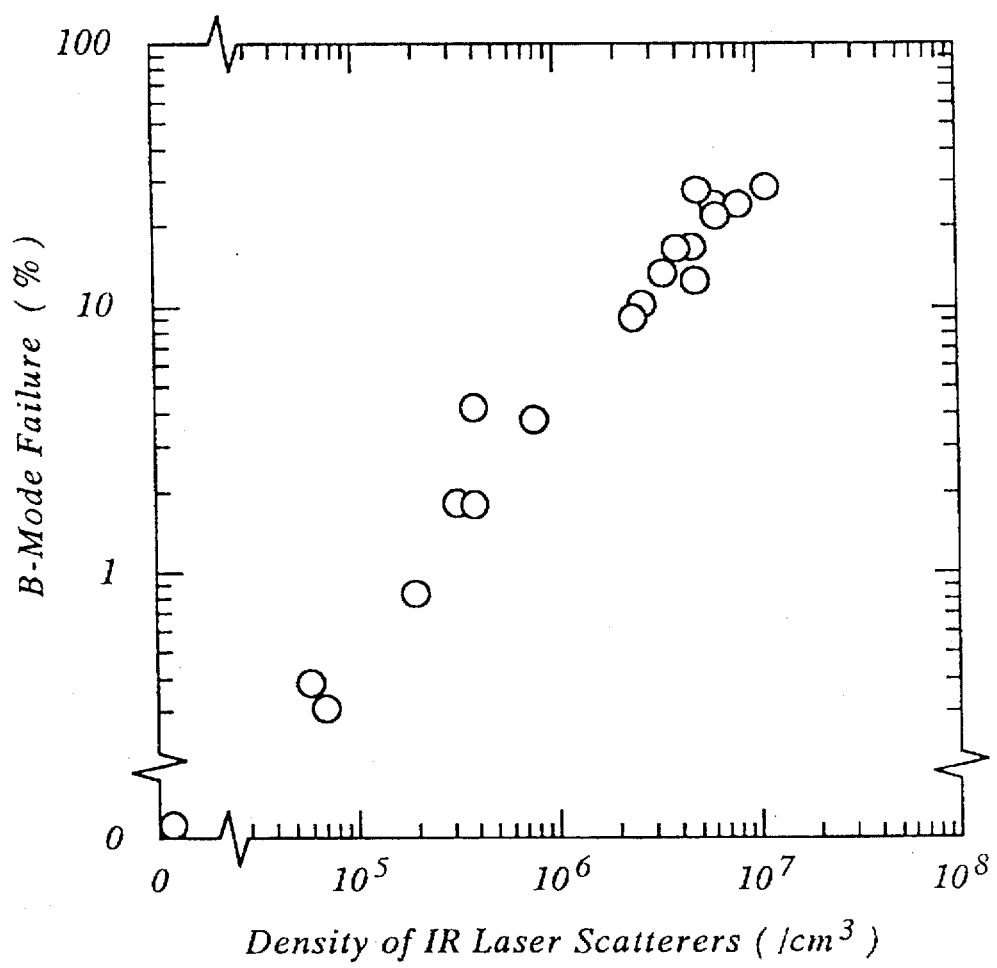
FIG. 2 illustrates the relationship between the density of IR laser scatterers in a surface region and B-mode failure.
Figure 3:
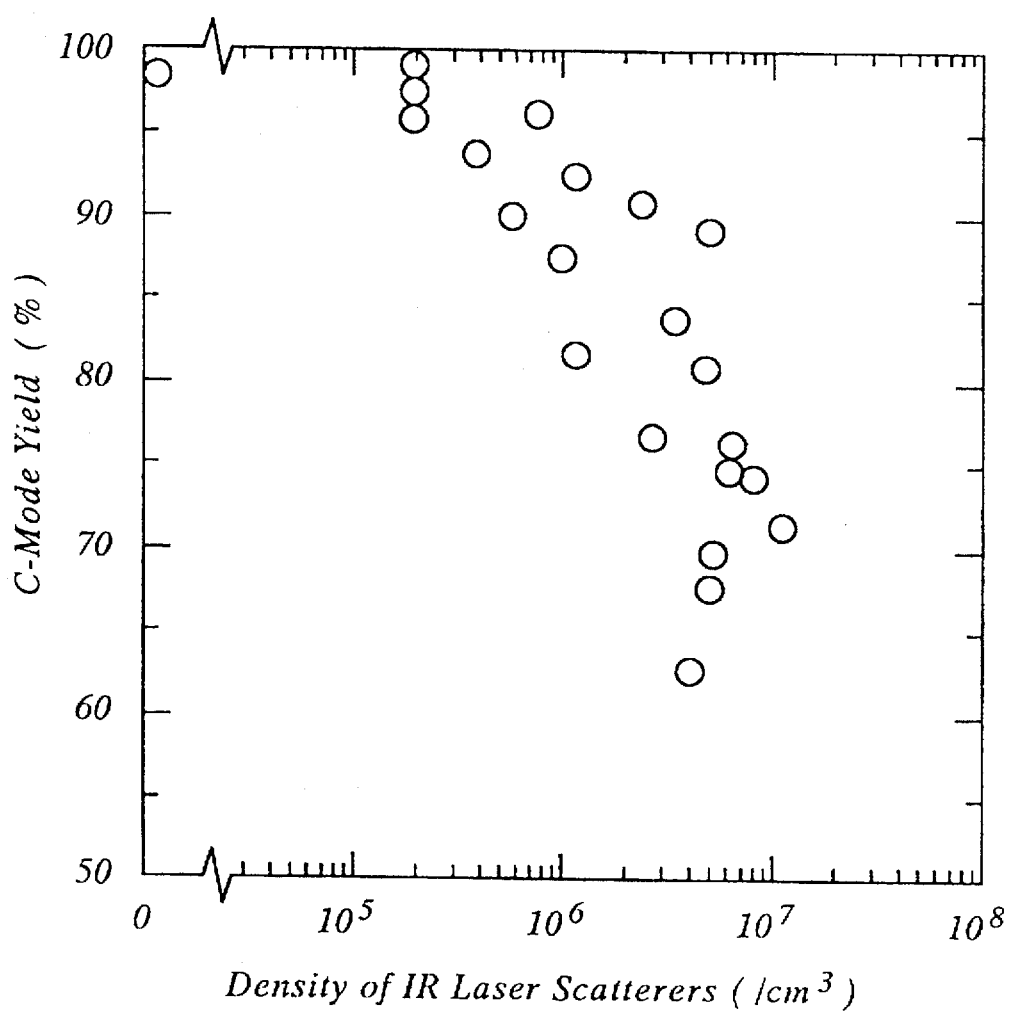
FIG. 3 illustrates the relationship between the density of IR laser scatterers in a surface region and C-mode yield.

FIG. 2 shows the relationship between the density of IR laser scatterers in the vicinity of the surface of the silicon wafer 1, that is, 0 to 3 μm in depth, and the proportion of B-mode failure wherein the breakdown voltage is in the range between 3 MV/cm and 8 MV/cm. It ill be appreciated from this figure that there is significant correlation between the density of IR laser scatterers and the B-mode failure, i.e., the B-mode failure increases with an increase in the density of IR laser scatterers. FIG. 3 shows the relationship between the density of IR laser scatterers and the proportion of C-mode yield wherein the breakdown voltage is 8 MV/cm or higher. It will be appreciated from this figure that the C-mode yield decreases with an increase in the density of IR laser scatterers.

Specifically, the C-mode yield must be 95% or higher in general with respect to the GOI. It is therefore apparent from FIG. 3 that the density of IR laser scatterers must be approximately $5 \times 10^5$ pieces/cm$^3$ or less. Since this equally applies to an epitaxial wafer, the density of IR laser scatterers must be $5 \times 10^5$ pieces/cm$^3$ or less to obtain an epitaxial wafer having a sufficiently high GOI.

Figure 4:
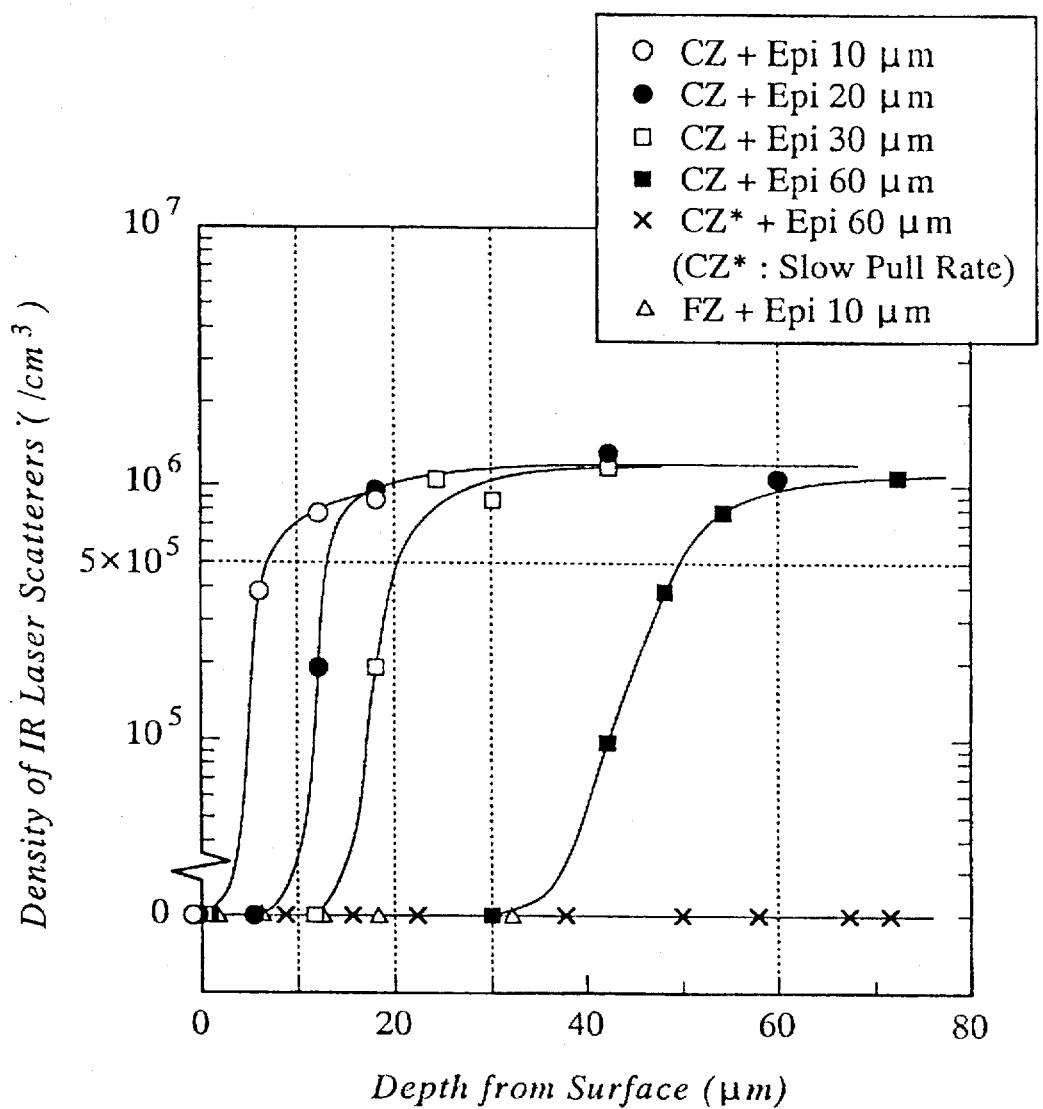
FIG. 4 illustrates the density profile of IR laser scatterers in the direction of depth of an epitaxial wafer.

FIG. 4 shows the measurement results of IR laser scatterer density in the direction of the depth of epitaxial wafers obtained by respectively forming epitaxial layers (written as "Epi" in drawing) having thicknesses of 10 μm, 20 μm, 30 μm and 60 μm on silicon wafer substrates fabricated using the Czochralski method (written as "CZ" in drawing), and an epitaxial wafer obtained by forming an epitaxial layer having a thickness of 10 μm on a silicon wafer substrate fabricated using the floating zone melting method (written as "FZ" in drawing). On the epitaxial wafers obtained by forming epitaxial layers on the silicon wafer substrates fabricated using the Czochralski method, the epitaxial layers grow with IR laser scatterers in a density equal to that of the substrates at the side of the interface with the substrates, while the density of the IR laser scatterers is zero at the surfaces of the epitaxial layers. Specifically, in this embodiment, the density of IR laser scatterers in the substrate is about $1 \times 10^6$ pieces/cm$^3$ while the density of IR laser scatterers is gradually reduced from $1 \times 10^6$ pieces/cm$^3$ to $5 \times 10^5$ pieces/cm$^3$ in a transition region at the substrate side of the epitaxial layer, and further reduced to zero. However, for a wafer similarly fabricated using the Czochralski method at a slow pull rate of 0.6 mm/min. having an epitaxial layer of 60 μm formed thereon, the density of IR laser scatterers is zero regardless of the depth from the surface of the wafer.

Figure 5:
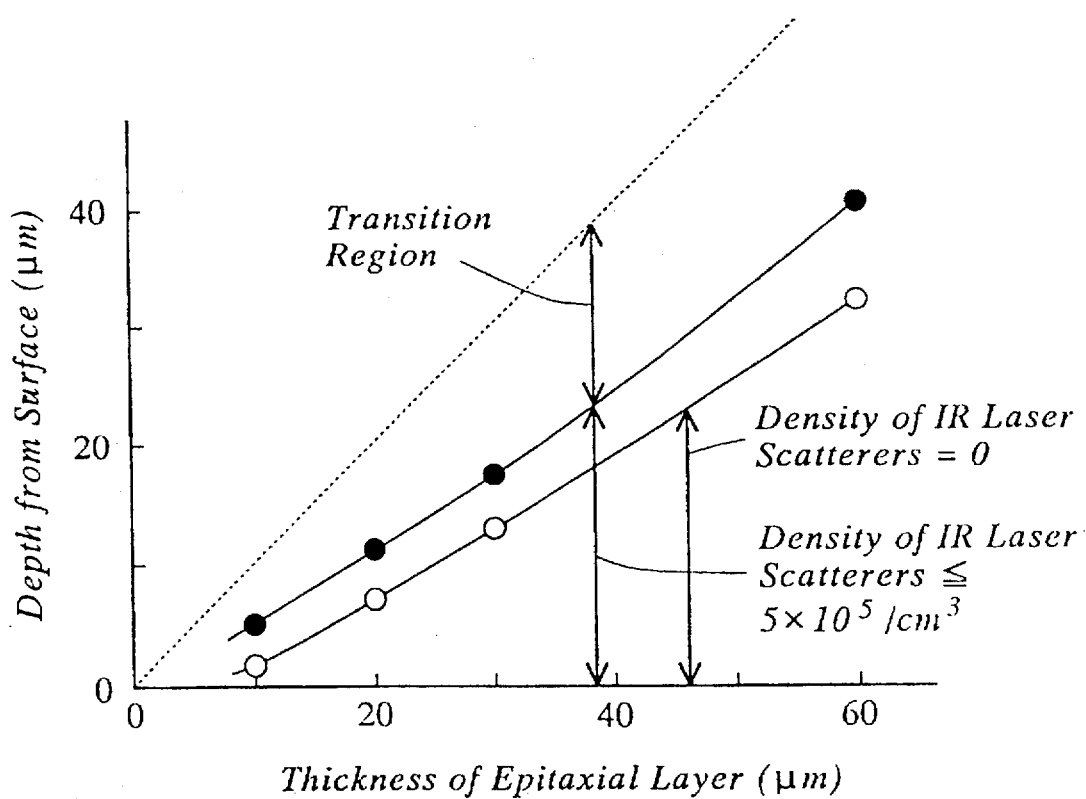
FIG. 5 illustrates a region having less defects and a transition region relative to the thickness of an epitaxial layer.

FIG. 5 illustrates the same results from a different point of view and shows a range wherein the density of IR laser scatterers is zero, and a range wherein the density is $5 \times 10^5$ pieces/cm$^3$ or less. It is apparent from this figure that the IR laser scatterer density is not necessarily zero throughout an epitaxial layer nor $5 \times 10^5$ pieces/cm$^3$ or less throughout the layer.

Returning back to FIG. 4 to see an epitaxial wafer which is obtained by forming an epitaxial layer on a silicon wafer substrate fabricated using the floating zone melting method, as the IR laser scatterer density is zero in the substrate in this case, the IR laser scatterer density in the epitaxial layer is also zero.

As previously described, the density of IR laser scatterers must be $5 \times 10^5$ pieces/cm$^3$ or less in order to get an epitaxial wafer having a sufficiently high GOI. In order that the density of IR laser scatterers is $5 \times 10^5$ pieces/cm$^3$ or less throughout an epitaxial layer, the IR laser scatterer density must be $5 \times 10^5$ pieces/cm$^3$ or less in the substrate as apparent from FIG. 4. As far as the inventors have studied, there has been no epitaxial wafer wherein the density of IR laser scatterers is $5 \times 10$ pieces/cm$^3$ or less throughout the epitaxial layer thereof.

Figure 7:
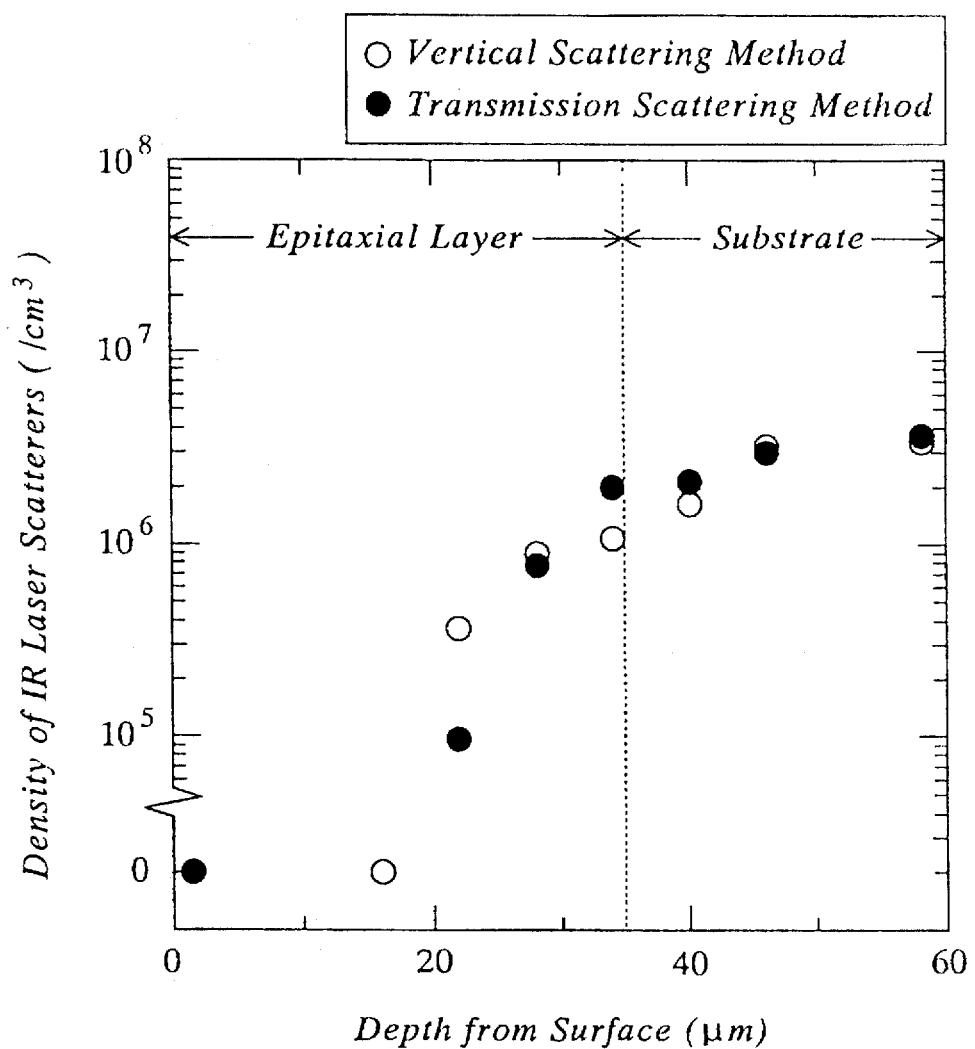
FIG. 7 illustrates the density profile of IR laser scatterers in the direction of depth of an epitaxial wafer obtained using a vertical scattering method and a transmission scattering method.

The above-described results on IR laser scatterers are based on an evaluation made in accordance with the transmission scattering method. But the same tendency has been observed, as shown in FIG. 7, in an evaluation made in accordance with the vertical scattering method using a laser beam having a wavelength of 1.06 μm. However, the measurement is difficult by the vertical scattering method in the vicinity of the surface of a wafer, that is, 0 to 10 μm in depth, due to scattered light at the surface of the wafer. Therefore, the result obtained using the transmission scattering method has been described, wherein measurement can be made on all parts of a wafer.

As a first means for reducing the density of IR laser scatterers in a substrate to $5 \times 10^5$ pieces/cm$^3$ or less, the substrate can be fabricated using the floating zone melting method as shown in FIG. 4. As a second means for reducing the density of IR laser scatterers to $5 \times 10^5$ pieces/cm$^3$ or less, the Czochralski method may be employed with the pull rate reduced to 0.6 mm/min. or less. However, this method has a problem in that it is poor from the viewpoint of productivity in growing crystals. As a third means, a description will be made on a method wherein a heat treatment is performed on single crystal silicon fabricated using the Czochralski method at a normal pull rate.

Figure 6:
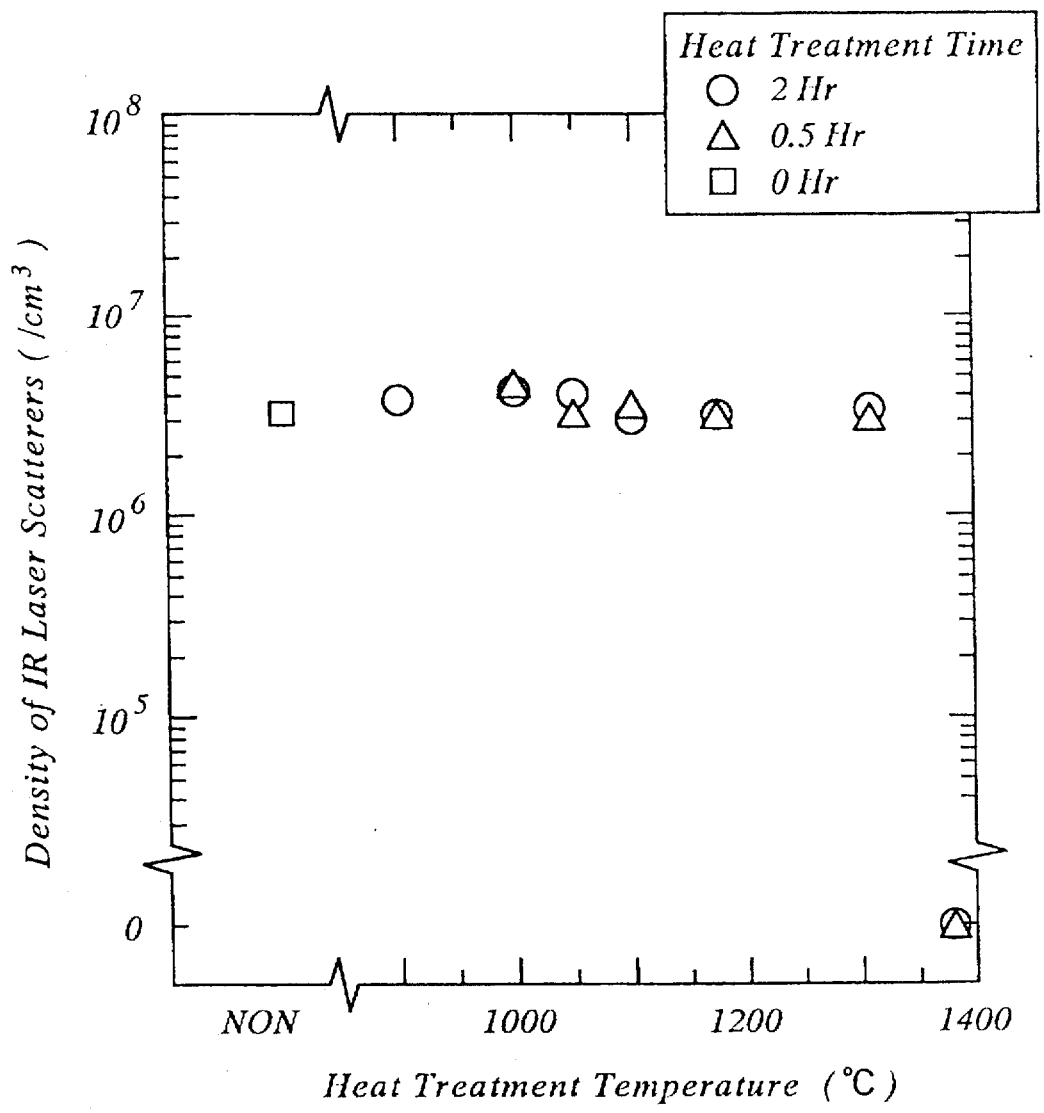
FIG. 6 illustrates the relationship between the density of IR laser scatterers in a surface region and the temperature of a heat treatment.

FIG. 6 shows the density of IR laser scatterers in the vicinity of the surface of the silicon wafer, that is, 0 to 3 μm in depth, under varied conditions for the heat treatment. As shown in this figure, there are IR laser scatterers in a density on the order of $3 \times 10^6$ pieces/cm$^3$ in this embodiment when no heat treatment is performed. It will be understood that this IR laser scatterer density remains almost unchanged even if the heat treatment is performed at temperatures up to about 1300° C., or the heat treatment is performed for a long time, which means that the IR laser scatterers are very stable. However, if the temperature for the heat treatment is increased beyond approximately 1330° C., the IR laser scatterers are almost completely eliminated after at least 0.5 hours of such heat treatment. Thus, the IR laser scatterers can be substantially completely eliminated by performing the heat treatment at a temperature in the range between 1330° and 1400° C., considering the melting point of silicon, for 0.5 hours or longer. And by forming an epitaxial layer on a substrate which has been subjected to such heat treatment, it is possible to obtain an epitaxial wafer in which the yield is sufficiently high with respect to the GOI.

There is no relationship between the processing of a silicon ingot into a silicon wafer and the heat treatment at 1330° to 1400° C. for 0.5 hours or longer. Therefore, the heat treatment may be performed not only after processing an ingot into a silicon wafer but also on a silicon ingot before processing which may be then processed into a silicon wafer. As to the device for such a heat treatment, a container to be exclusively used for the heat treatment may be employed. Alternatively, a pulling device itself may be used as a heating furnace, which method is advantageous especially when the heat treatment is performed on a silicon ingot.

Besides the above-described embodiment, epitaxial growth was observed on a crystal of specifications as follows, which is obtained using the Czochralski method at a pull rate of 0.6 mm/min. or slower.

Diameter: 6 inches
Crystal axis: <100>
P-type
Boron-doped

Resistivity: 0.01 to 0.02 Ωcm

Concentration of Oxygen: 12 to $15 \times 10^{17}$ atoms/cm$^3$

In this case, the number of IR laser scatterers in the epitaxial layer was also $5 \times 10^5$ pieces/cm$^3$ or less and similar effects were obtained with respect to electrical characteristics such as GOI and the current leakage at the P-N junction.

Further, epitaxial growth was observed on a crystal of specifications as follows, which is obtained using the Czochralski method at a normal pull rate and is performed with a heat treatment at a temperature in the rage between 1330° and 1400° C. for 0.5 hours or longer.

Diameter: 6 inches

Crystal axis: <100>

N-type

Antimony-doped

Resistivity: 0.01 to 0.02 Ωcm

Concentration of Oxygen: 13 to $16 \times 10^{17}$ atoms/cm$^3$

Again, the number of IR laser scatterers in the epitaxial layer was $5 \times 10^5$ pieces/cm$^3$ or less and similar effects were obtained with respect to electrical characteristics such as GOI and the current leakage at the P-N junction.

For an epitaxial wafer substrate having low resistivity on the order of 0.01 Ωcm, an improvement can be expected in anti-latch-up characteristics after formation of devices. Specifically, since the present invention suppresses the IR laser scatterers in the epitaxial layer which grow with succeeding that of the epitaxial wafer substrate, the thickness of the epitaxial layer can be reduced down to the thickness of the device active layer, so that an advantage is obtained, from an industrial point of view, in the improved anti-latch-up characteristics.

Next, as previously described, as for an epitaxial wafer obtained by forming an epitaxial layer on a silicon wafer fabricated using the Czochralski method, there exists a transition region at the side of the epitaxial layer closer to the substrate. Therefore, only a layer closer to the surface than the transition region can be used for an active region. In this case, the anti-latch-up characteristics of the devices formed can be improved by making the electrical resistivity of the used layer higher than that of the transition region.

Specifically, assume that the transition region and the used layer are referred to as a first sub-layer and a second sub-layer, respectively. Then, the thickness of the second sub-layer serving as the used layer is first decided; the overall thickness of the epitaxial layer required in order that the density of IR laser scatterers in the second sub-layer is $5 \times 10^5$ pieces/cm$^3$ or less, is obtained according to FIG. 5; and the thickness of the first sub-layer is obtained by subtracting the thickness of the second sub-layer from the overall thickness. Thereafter, if the substrate, for example, is Boron-doped and has an electrical resistivity of 0.01 to 0.02 Ωm, the first sub-layer is formed as to also be Boron-doped with an electrical resistivity in the order of 0.01 to 0.02 Ωcm. And the second sub-layer is provided with an electrical resistivity of, for example, 5 to 10 Ωcm. Since this makes the density of IR laser scatterers in the second epitaxial sub-layer low, it is possible to minimize the thickness of such epitaxial layers and consequently to provide an epitaxial wafer having excellent anti-latch-up characteristics.

As described above, the present invention makes it possible to promote improvements in electrical characteristics such as a GOI and a current leakage at a P-N junction and to thereby obtain an epitaxial wafer having excellent anti-latch-up characteristics by reducing the density of IR laser scatterers in an epitaxial layer to $5 \times 10^5$ pieces/cm$^3$ or less. Although the embodiments of the present invention have been described above, various modifications are possible without departing from the spirit of the invention which is defined solely in the appended claims.

What is claimed is:

1. A process of fabricating an epitaxial wafer having a surface layer where semi-conductor devices are to be formed, said surface layer having a density of IR laser scatterers less than $5 \times 10^5$ pieces/cm$^3$, characterized in that said process comprises the steps of:

forming on a substrate a first epitaxial sub-layer having the same conductivity type and substantially the same electrical resistivity as the substrate, said first sub-layer being grown to have a sufficient thickness so that a density of IR laser scatterers at least at the surface region of the first sub-layer becomes less than $5 \times 10^5$ pieces/cm$^3$, and forming on said first sub-layer a second epitaxial sub-layer having a higher electrical resistivity than the first sub-layer, said second sub-layer being grown to have a sufficient thickness so that the second sub-layer becomes said surface layer where the semi-conductor devices are to be formed.

2. A process of fabricating an epitaxial wafer according to claim 1, wherein said substrate is a wafer fabricated using a floating zone melting method.

3. A process of fabricating an epitaxial wafer according to claim 1, wherein said substrate is a wafer using a Czochralski method at a pull rate of 0.6 mm/min. or slower.

4. A process of fabricating an epitaxial wafer according to claim 1, wherein said substrate is a wafer which has been subjected to a heat process at a temperature in the range between 1330° and 1400° C. for 0.5 hours or longer after being fabricated using a Czochralski method.

* * * * *